(12) United States Patent
Ahmed et al.

(10) Patent No.: US 8,860,521 B2
(45) Date of Patent: Oct. 14, 2014

(54) VARIABLE INDUCTOR FOR LC OSCILLATOR

(71) Applicant: Intel IP Corporation, Santa Clara, CA (US)

(72) Inventors: Rizwan Ahmed, Chandler, AZ (US); Curtiss Roberts, Chandler, AZ (US); Chi Taou Tsai, Chandler, AZ (US)

(73) Assignee: Intel IP Corporation, Santa Clara, CA (US)

( * ) Notice: Subject to any disclaimer, the term of this patent is extended or adjusted under 35 U.S.C. 154(b) by 29 days.

(21) Appl. No.: 13/720,705

(22) Filed: Dec. 19, 2012

(65) Prior Publication Data

US 2014/0167867 A1    Jun. 19, 2014

(51) Int. Cl.
*H03B 5/08* (2006.01)
*H01F 29/02* (2006.01)
*H01F 27/28* (2006.01)
*H01F 29/00* (2006.01)

(52) U.S. Cl.
CPC . *H03B 5/08* (2013.01); *H01F 29/00* (2013.01)
USPC ........................ 331/181; 331/36 L; 331/117 R (58) Field of Classification Search
USPC .... 331/36 C, 36 L, 117 FE, 117 R, 167, 181; 336/220, 223, 225, 226, 232; 333/137, 333/220, 223, 225, 226, 232
See application file for complete search history.

(56) References Cited

U.S. PATENT DOCUMENTS

| | | | | |
|---|---|---|---|---|
| 7,151,430 B2 * | 12/2006 | Mattsson | | 336/200 |
| 7,202,754 B2 * | 4/2007 | Komurasaki et al. | | 331/181 |
| 7,202,768 B1 | 4/2007 | Harvey et al. | | 336/232 |
| 7,432,794 B2 | 10/2008 | Mattsson | | 336/225 |
| 7,629,859 B2 * | 12/2009 | Rai | | 331/167 |
| 7,633,352 B2 * | 12/2009 | El Rai | | 331/181 |
| 8,018,312 B2 * | 9/2011 | Kossel et al. | | 336/200 |
| 8,044,756 B2 * | 10/2011 | Fahs | | 336/200 |
| 8,183,971 B2 * | 5/2012 | Le Guillou et al. | | 336/200 |
| 8,310,316 B2 * | 11/2012 | Tanabe et al. | | 331/117 R |
| 8,339,210 B2 * | 12/2012 | Nylen | | 331/117 R |
| 2005/0068146 A1 | 3/2005 | Jessie | | 336/200 |
| 2008/0284534 A1 * | 11/2008 | El Rai | | 331/117 FE |
| 2011/0102093 A1 * | 5/2011 | El Rai et al. | | 331/117 FE |
| 2013/0082793 A1 * | 4/2013 | Eldredge et al. | | 331/167 |
| 2013/0099870 A1 * | 4/2013 | Terrovitis | | 331/56 |

OTHER PUBLICATIONS

Wang et al.; "Demonstration of an Area-Cost-Efficient Switched Differential Inductor for VCO Circuit Applications"; Workshop on Consumer Electronics and Signal Processing; pp. 5, 2005.

* cited by examiner

*Primary Examiner* — Levi Gannon (74) *Attorney, Agent, or Firm* — Baker Botts L.L.P.

(57) ABSTRACT

A variable inductor is disclosed. In accordance with some embodiments of the present disclosure, a variable inductor may comprise a single-turn conductor comprising a first inductor terminal, a second inductor terminal, a first base portion extending from the first inductor terminal to a first intersection location, a second base portion extending from the second inductor terminal to a second intersection location, and a switched portion extending from the first intersection location to the second intersection location, and a switch comprising a first conductive terminal coupled to the first intersection location and a second conductive terminal coupled to the second intersection location.

18 Claims, 5 Drawing Sheets

VARIABLE INDUCTOR FOR LC OSCILLATOR

TECHNICAL FIELD

The present disclosure relates generally to electronic circuits and, more particularly, to variable inductors for inductor-capacitor ("LC") oscillators.

BACKGROUND

Voltage-controlled oscillators ("VCOs") are used in a variety of integrated circuit applications. A critical performance parameter of a VCO is the frequency of its output signal. Some integrated circuit applications may require the oscillator frequency to be adjustable. For example, tuning of a VCO output frequency may be required to account for frequency variation that may occur across a range of potential operating conditions, including, but not limited to, varying temperature, varying supply voltage, or semiconductor process variation. Further, some integrated circuit applications may require multiple oscillator frequencies. In multi-mode or multi-band cellular phone transceiver designs, for example, the transceiver may need to operate at different frequencies at different times depending on the mode in which the transceiver is operating.

SUMMARY

In accordance with some embodiments of the present disclosure, a variable inductor may comprise a single-turn conductor comprising a first inductor terminal, a second inductor terminal, a first base portion extending from the first inductor terminal to a first intersection location, a second base portion extending from the second inductor terminal to a second intersection location, and a switched portion extending from the first intersection location to the second intersection location, and a switch comprising a first conductive terminal coupled to the first intersection location and a second conductive terminal coupled to the second intersection location.

Technical advantages of the present disclosure may be readily apparent to one skilled in the art from the figures, description and claims included herein.

DETAILED DESCRIPTION

Figure 1:
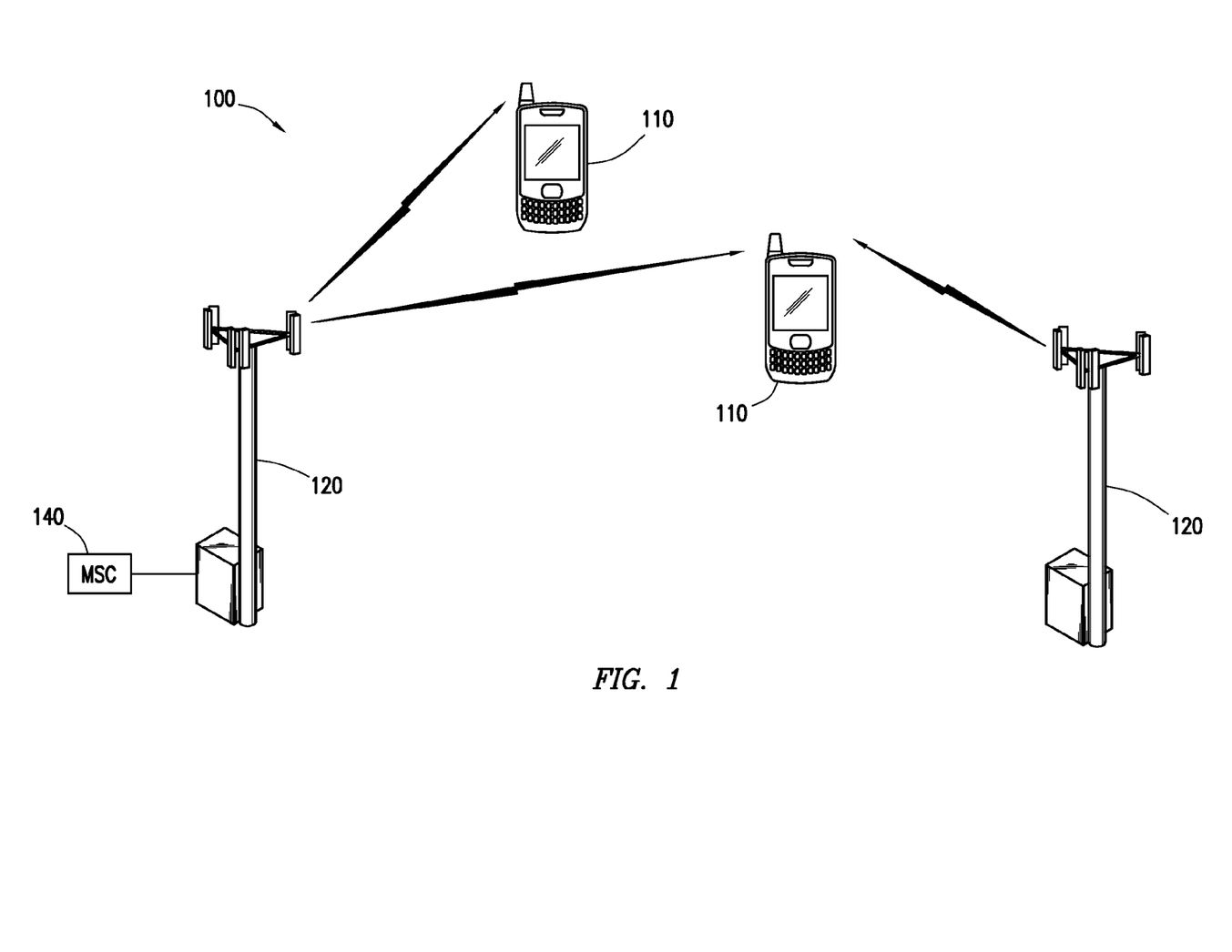
FIG. 1 depicts a block diagram of an example wireless communication system, in accordance with certain embodiments of the present disclosure.

FIG. 1 depicts a block diagram of an example wireless communication system 100, in accordance with certain embodiments of the present disclosure. For simplicity, only two terminals 110 and two base stations 120 are shown in FIG. 1. A terminal 110 may also be referred to as a remote station, a mobile station, an access terminal, user equipment (UE), a wireless communication device, a cellular phone, or some other terminology. A base station 120 may be a fixed station and may also be referred to as an access point, a Node B, or some other terminology. A mobile switching center (MSC) 140 may be coupled to the base stations 120 and may provide coordination and control for base stations 120.

In some embodiments, terminal 110 may receive signals from one or more transmitting sources simultaneously. For example, a transmitting source may be base station 120 or a different terminal 110. In certain embodiments, a terminal 110 may also be a transmitting source.

In some embodiments, system 100 may be a Code Division Multiple Access (CDMA) system, a Time Division Multiple Access (TDMA) system, or some other wireless communication system. A CDMA system may implement one or more CDMA standards such as IS-95, IS-2000 (also commonly known as "1x"), IS-856 (also commonly known as "1xEV-DO"), Wideband-CDMA (W-CDMA), and so on. A TDMA system may implement one or more TDMA standards such as Global System for Mobile Communications (GSM). The W-CDMA standard is defined by a consortium known as 3GPP, and the IS-2000 and IS-856 standards are defined by a consortium known as 3GPP2.

Figure 2:
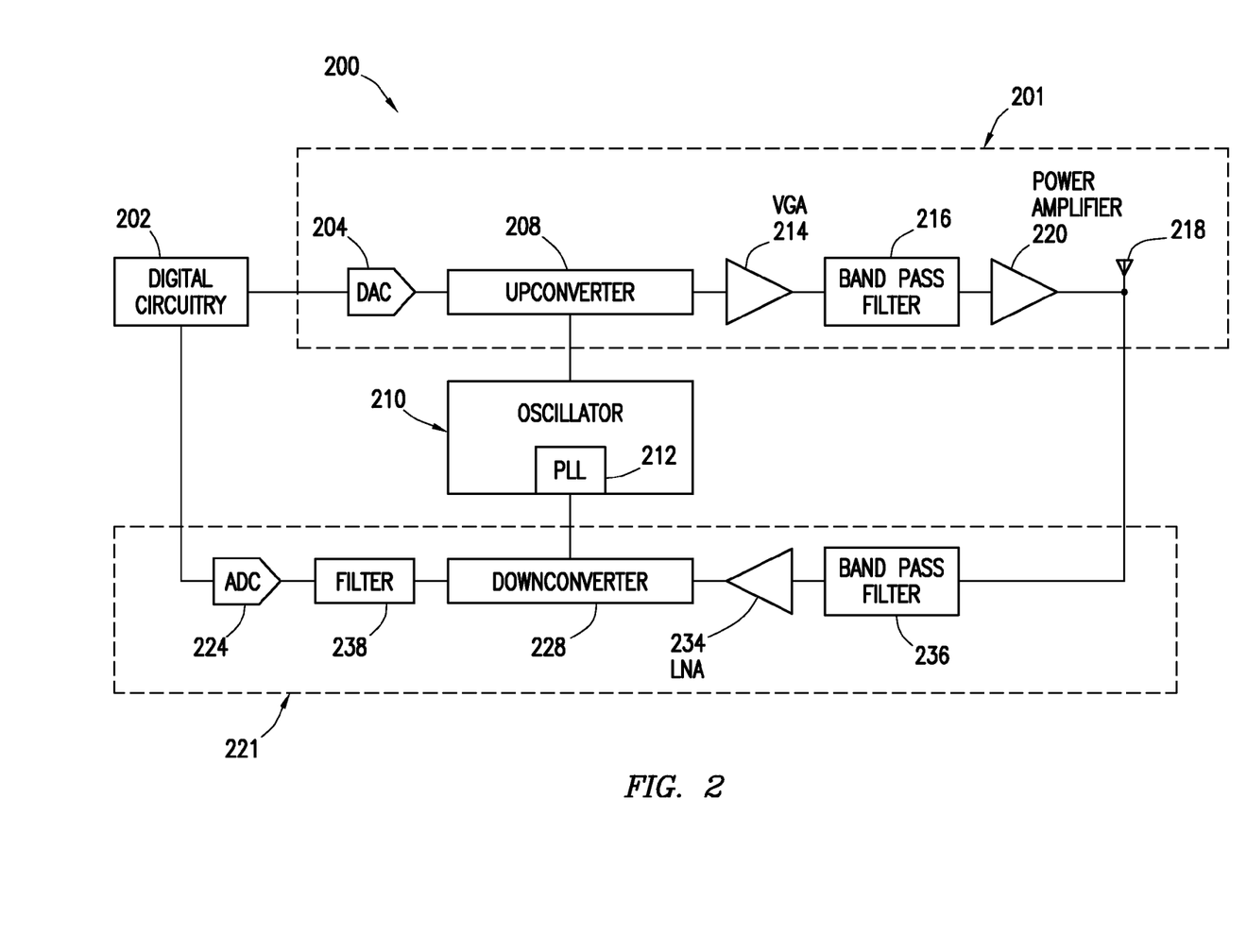
FIG. 2 depicts a block diagram of selected components of an example transmitting and/or receiving element, in accordance with certain embodiments of the present disclosure.

FIG. 2 depicts a block diagram of certain components of an example transmitting and/or receiving element 200, in accordance with certain embodiments of the present disclosure. Terminal 110 and/or base station 120, as described in greater detail above with reference to FIG. 1, may include element 200 as a means for transmitting and/or receiving communications signals. Element 200 may include transmit path 201 and/or receive path 221. Depending on the functionality of element 200, element 200 may be considered a transmitter, a receiver, or a transceiver.

In some embodiments, element 200 may include digital circuitry 202. Digital circuitry 202 may include any system, device, or apparatus configured to process digital signals and information received via receive path 221, and/or configured to process signals and information for transmission via transmit path 201. Such digital circuitry 202 may include one or more microprocessors, digital signal processors, and/or other suitable devices.

Transmit path 201 may include digital-to-analog converter (DAC) 204. DAC 204 may be configured to receive a digital signal from digital circuitry 202 and convert such digital signal into an analog signal. Such analog signal may then be passed to one or more other components of transmit path 201, including upconverter 208.

Upconverter 208 may be configured to frequency upconvert an analog signal received from DAC 204 to a wireless communication signal at one or more radio frequencies based on one or more oscillator signals provided by oscillator 210. Oscillator 210 may be any suitable device, system, or apparatus configured to produce an analog waveform of a particular frequency for modulation or upconversion of an analog signal to a wireless communication signal, or for demodulation or downconversion of a wireless communication signal to an analog signal.

In some embodiments, oscillator 210 may include phase-locked loop ("PLL") 212. PLL 212 may be a control system configured to generate a signal that has a fixed relation to the phase of a "reference" input signal by responding to both the frequency and the phase of the input signal, and automatically raising or lowering the frequency of a controlled oscillator until it is matched to the reference in both frequency and phase. PLL 212 may be described in greater detail below with reference to FIG. 3.

In some embodiments, transmit path 201 may include variable-gain amplifier ("VGA") 214 to amplify an upconverted signal for transmission, and bandpass filter 216 configured to receive an amplified signal and pass signal components in the band of interest and remove out-of-band noise and undesired signals. The bandpass filtered signal may be received by power amplifier 220 where it may be amplified for transmission via antenna 218. Antenna 218 may receive the amplified signal and transmit such signal (e.g., to one or more of terminal 110 and/or a base station 120).

In some embodiments, receive path 221 may include bandpass filter 236 configured to receive a wireless communication signal (e.g., from a terminal 110 or a base station 120) via antenna 218. Bandpass filter 236 may pass signal components in the band of interest and remove out-of-band noise and undesired signals. Receive path 221 may also include low-noise amplifier ("LNA") 234 to amplify a signal received from bandpass filter 236.

Receive path 221 may also include downconverter 228. Downconverter 228 may be configured to frequency downconvert a wireless communication signal received via antenna 218 and amplified by LNA 234 by an oscillator signal provided by oscillator 210 (e.g., downconvert to a baseband signal). Receive path 221 may further include filter 238, which may be configured to filter a downconverted wireless communication signal in order to pass the signal components within a radio-frequency channel of interest and/or to remove noise and undesired signals that may be generated by the downconversion process. Receive path 221 may include analog-to-digital converter (ADC) 224 configured to receive an analog signal from filter 238 and convert such analog signal into a digital signal. Such digital signal may then be passed to digital circuitry 202 for processing.

Figure 3:
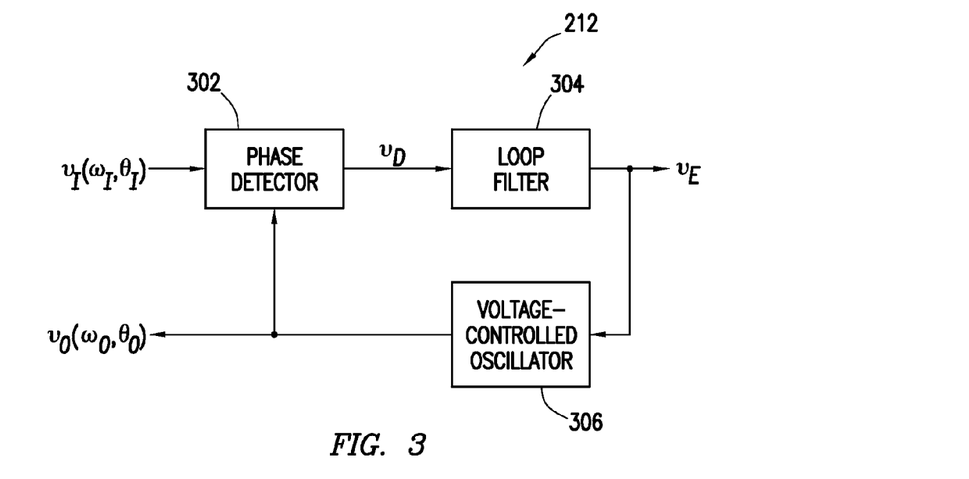
FIG. 3 depicts a block diagram of an example phase locked loop (PLL), in accordance with certain embodiments of the present disclosure.

FIG. 3 illustrates a block diagram of certain components of an example PLL such as PLL 212, described above with reference to FIG. 2, in accordance with certain embodiments of the present disclosure. PLL 212 may be a frequency-selective circuit designed to synchronize an incoming signal, denoted $v_I(\omega_I, \theta_I)$ and maintain synchronization in spite of noise or variations in the incoming signal frequency. In some embodiments, PLL 212 may comprise phase detector 302, loop filter 304, and voltage-controlled oscillator ("VCO") 306.

Phase detector 302 may be configured to compare the phase $\theta_I$ of the incoming reference signal $v_I$ to the phase $\theta_O$ of the VCO 306 output $v_O$, and produce a voltage $V_D$ proportional to the difference $\theta_I$-$\theta_O$. Voltage $V_D$ may be filtered by loop filter 304 to suppress high-frequency ripple and noise, and the result, called the error voltage $v_E$, may be applied to a control input of VCO 306 to adjust its frequency $\omega_{vco}$. VCO 306 may be configured such that its oscillation frequency may depend in part on one or more tuning signals (not expressly shown), as well as an error voltage $v_E$ from loop filter 304. For example, VCO 306 may be configured such that with $v_E$=0, it oscillates at some initial frequency $\omega_0$ (which may be referred to as the free-running frequency) so that a characteristic of VCO 306 may be described by Equation 1:

$$\omega_{vco}=\omega_0+(K_V \cdot v_E(t))$$

where $K_V$ is the gain of VCO 306, in radians-per-second per volt. In some embodiments, if a periodic input is applied to PLL 212 with frequency $\omega_I$ sufficiently close to the free-running frequency $\omega_0$, an error voltage $v_E$ will develop, which will adjust $\omega_{vco}$ until $v_O$ becomes synchronized, or locked, with $v_I$. Should $\omega_I$ change, the phase shift between $v_O$ and $v_I$ may start to increase, changing $V_D$ and $v_E$. VCO 306 may be configured such that this change in $v_E$ adjusts $\omega_{vco}$ until it is brought back the same value as $\omega_I$, allowing PLL 212, once locked, to track input frequency changes.

Figure 4:
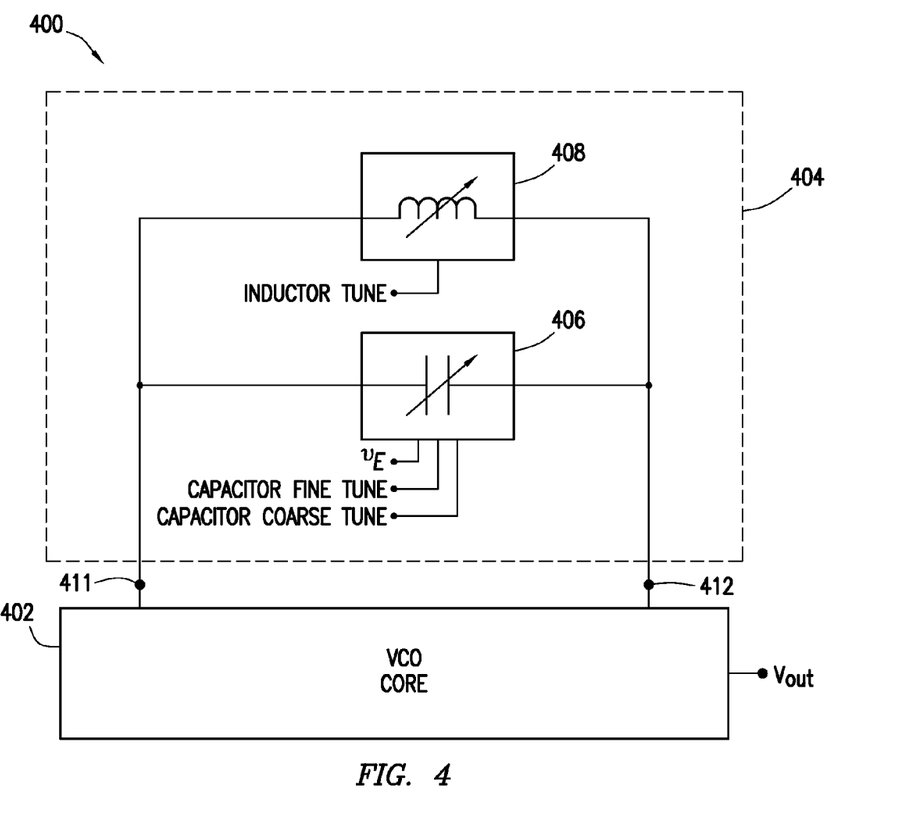
FIG. 4 depicts a schematic diagram of an example voltage-controlled oscillator with an LC-resonator, in accordance with certain embodiments of the present disclosure.

As described above with reference to FIG. 3, PLL 212 may include a VCO. FIG. 4 illustrates a schematic diagram of an example VCO 400, in accordance with certain embodiments of the present disclosure. In some embodiments, VCO 400 may include VCO core 402 and LC-resonator 404. LC-resonator 404 may include capacitor 406 and inductor 408 coupled together in parallel. VCO core 402 may have a first input 411 and a second input 412 coupled respectively to the opposing terminals of capacitor 406 and inductor 408. VCO core 402 may include circuitry that may be configured to apply a gain to a signal generated across the LC resonator and to provide an oscillating output signal.

In some embodiments, the oscillating frequency of VCO 400 may be based on the values of capacitor 406 and inductor 408. For example, the oscillating frequency ("$f_o$") of VCO 400 may be as described by Equation 2:

$$f_o = \frac{1}{2\pi\sqrt{LC}}$$

where L may be the inductance value of inductor 408 and C may be the capacitance value of capacitor 406.

In some embodiments, the capacitance of capacitor 406 may be varied by any suitable means. Capacitor 406 may include portions that are controlled by tuning inputs. For example, capacitor 406 may include a portion that may be controlled by a coarse tuning input, and a portion that may be controlled by a fine tuning input. These coarse and fine tuning portions may be varied by any suitable means. For example, in some embodiments, the tuning portions may include one or more voltage variable capacitors ("VVCs") (also known in the art as "varicaps"), or by an array of individually selectable capacitors that can be switched in or out to contribute to the total capacitance of capacitor 406. The coarse tuning portion and the fine tuning portions may be used in combination to tune VCO 400 to a frequency that may be close to a desired oscillation frequency. Moreover, capacitor 406 may include a portion driven by the error voltage $v_E$. The portion driven by the error voltage $v_E$ may include one or more VVCs, which may be varied based on the voltage of the error voltage $v_E$. The error voltage $v_E$ may thus control the frequency of VCO 400, and accordingly, may provide the frequency control of the PLL loop.

As described above, the oscillation frequency of VCO 400 may be varied as a function of varying the value of capacitor 406. The tuning portions of capacitor 406, for example, may allow the output of VCO 400 to be tuned close to a desired frequency. In some embodiments, such tuning may compensate for frequency variation that may occur across a range of potential operating conditions, including, but not limited to, varying temperature, varying supply voltage, or semiconductor process variation. In some embodiments, such tuning may be used to set the output of VCO 400 to different frequencies that may be required by transceiver element 200 when operating in different modes. However, the variation of capacitor 406 may be limited by one or more design considerations. For example, the variation of a VVC may be limited by the available range of bias voltages or by other inherent physical characteristics. Likewise, an array of switchable capacitors may be limited by the acceptable amount of area consumption on a semiconductor chip. Accordingly, the range of tunable frequencies provided by a variable capacitor may be limited.

In some applications, transceiver element 200 may require largely different frequencies during different transceiver modes. When the step size between the required frequencies is greater than the tunable range provided by a VCO's variable capacitor, the multiple frequencies may be achieved by having two or more VCOs designed for different frequencies. However such duplication may consume considerable semiconductor chip area. Further, such a solution may require further buffering circuitry and an RF switch in order to select the proper VCO signal during different transceiver modes. This additional circuitry may consume additional chip area. Accordingly, an additional means of varying the output frequency of VCO 400 may be desired in order to efficiently provide largely different frequencies from a single instantiation of VCO 400.

In some embodiments, inductor 408 may be variable. For example, the value of inductor 408 may be controlled by an inductor tune input. Accordingly, the output frequency of VCO 400 may be varied as a function of the value of inductor 408. In some embodiments, inductor 408 may be used as the lone variable in LC resonator 404 for adjusting the output frequency of VCO 400. In some embodiments, inductor 408 may be varied together with capacitor 406 in order to further expand the range of frequencies that may otherwise be provided by varying capacitor 406. For example, in some embodiments, the output frequency of VCO 400 may be initially tuned by the selection of an inductance value for inductor 408 and further tuned by the variation of one or more capacitive tuning portions that may be included in capacitor 406. In some embodiments employing such a tuning scheme, the step size for varying the inductor may be small enough such that the range of potential frequencies at a first inductor setting may overlap or be continuous with the range of potential frequencies at a second inductor value. In other embodiments employing such a tuning scheme, the step size for varying the inductor may be large enough such that the range of potential frequencies at a first inductor setting may be wholly separate from the range of potential frequencies at a second inductor value.

Figure 5:
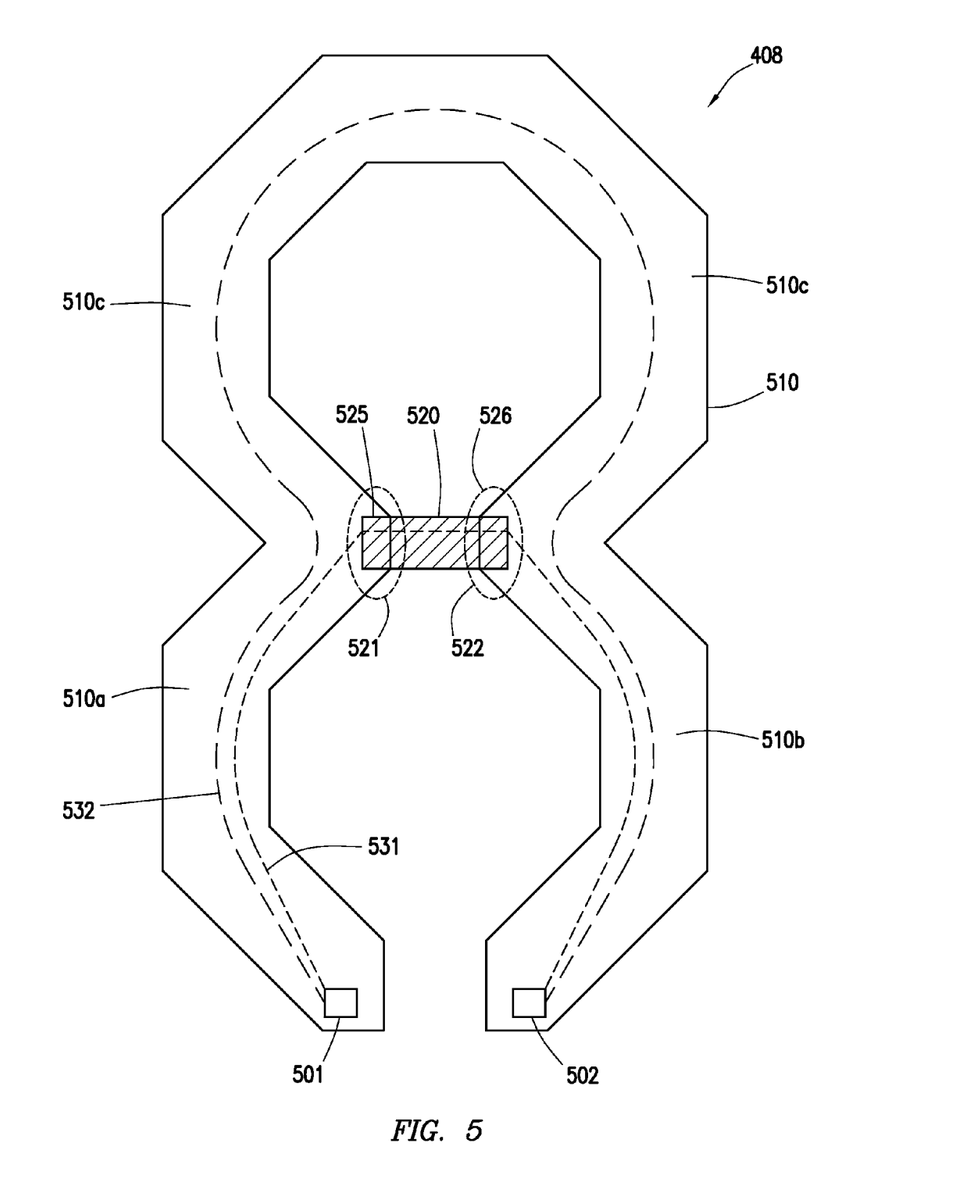
FIG. 5 depicts a top-view layout diagram of an example variable single-turn inductor, in accordance with certain embodiments of the present disclosure.

FIG. 5 depicts a top-view layout diagram of an example variable inductor 408, in accordance with certain embodiments of the present disclosure. In some embodiments, variable inductor 408 may include first terminal 501, second terminal 502, conductor 510, and switch 520.

In some embodiments, conductor 510 may extend on a single layer of conductive material (e.g., on a single layer of what is referred to in the art as metal) from approximately first terminal 501 to approximately second terminal 502. Conductor 510 may include multiple portions. In some embodiments, first base portion 510a may extend from approximately first terminal 501 to approximately first intersection location 521, second base portion 510b may extend from approximately second terminal 502 to approximately second intersection location 522, and switched portion 510c may extend from approximately first intersection location 521 to approximately second intersection location 522.

In some embodiments, variable inductor 408 may include switch 520, which may be controlled by an inductor tune input. Switch 520 may include a first conductive terminal 525 coupled to conductor 510 at first intersection location 521 and second conductive terminal 526 coupled to conductor 510 at second intersection location 522. Switch 520 may comprise, for example, an n-type metal-oxide semiconductor field-effect transistor (NMOS), a p-type metal-oxide semiconductor field-effect transistor (PMOS) transistor, or any other suitable type of transistor.

The inductance of variable inductor 408 may be varied by closing switch 520 (e.g., turning a transistor on) and opening switch 520 (e.g., turning a transistor off). For example, if switch 520 is open, the inductance of variable inductor 408 may be the inductance of path 532 formed along first base portion 510a, switched portion 510c, and second base portion 510b. If switch 520 is closed, the inductance of variable inductor 408 may be the inductance of path 531 formed along first base portion 510a, switch 520, and second base portion 510b. In some embodiments, conductor 510 may form a "single turn" from first terminal 501 to second terminal 502. Accordingly, path 532 may form a "single turn." Similarly, path 531 may also form a "single turn." Accordingly, variable inductor 408 may be what is referred to in the art as a "single-turn" inductor when switch 520 is turned on and when switch 520 is turned off.

Path 531 may be smaller than path 532. Accordingly, variable inductor 408 may have a relatively larger inductance when switch 520 is open, and a relatively smaller inductance when switch 520 is closed. As described in more detail with reference to FIG. 4, the oscillating frequency of VCO 400 utilizing LC resonator 404 may increase if the inductance of variable inductor 408 decreases. Thus, VCO 400 may operate at a relatively lower frequency or range of frequencies when switch 520 is open, and at a relatively higher frequency or range of frequencies when switch 520 is closed.

For example, in some embodiments, conductor 510 may be sized such that the inductance of path 532 may be 400 pH, and the inductance of path 531 may be 200 pH. Such example embodiments of variable inductor 408 may be combined with variable capacitor 406 as described in more detail above with reference to FIG. 4. For example, variable capacitor 406 may be designed to vary from 3 pF to 6 pF in multiple steps. Accordingly, when switch 520 is open, the inductance of variable inductor 408 may be set to 400 pH, and the frequency of VCO 400 may be set to a frequency between approximately 3.25 GHz and 4.60 GHz depending on variable capacitor 406. Upon receiving an instruction to change to a higher frequency mode, for example, switch 520 may be closed. When switch 520 is closed, the inductance of variable inductor 408 may be set to 200 pH, and the frequency of VCO 400 may be set to a frequency between approximately 4.60 GHz and 6.50 GHz depending on variable capacitor 406.

In some embodiments, the respective portions of conductor 510 may be sized larger or smaller in order to provide inductance values that correspond to desired frequency ranges. Path 531 may provide variable inductor 408's smallest inductance setting, and thus may determine the highest corresponding frequency setting of VCO 400. Accordingly, first base portion 510a and second base portion 510b may be sized larger or smaller as compared to the layout diagram of the example embodiment illustrated in FIG. 5 in order to set the high end of VCO 400's frequency range at a desired level. Similarly, path 532 may provide variable inductor 408's highest inductance setting, and thus may determine the lowest corresponding frequency setting of VCO 400. Accordingly, after first base portion 510a and second base portion 510b are sized to provide a desired high-end frequency, switched portion 510c may be sized larger or smaller as compared to the layout diagram of the example embodiment illustrated in FIG. 5 in order to set the low end of VCO 400's frequency range at a desired level.

In some embodiments, variable inductor 408 may include multiple switches (e.g., switch 520) coupled respectively to conductor 510 at multiple sets of intersection locations (e.g., first intersection location 521 and corresponding second intersection location 522). Variable inductor 408 may thus provide for more than two inductive settings. For example, variable inductor 408 may be defined by the inductance of a first path when a first switch is closed and a second switch is open, a second path when the first switch is open and the second switch is closed, and a third path when the first and second switches are both open. Similar to the description above with reference to FIG. 5, the respective sizes of any base portions and switched portions may be sized so that the first, second, and third paths have varied lengths and/or inductances according to the desired variable inductance range and step size.

In some embodiments, it may be necessary or desirable to account for the quality factor ("Q-factor" or "Q") of the inductor in designing a particular configuration for VCOs utilizing an LC resonator. The Q-factor may be defined as follows in equation 3:

$$Q = \frac{\omega L}{R}$$

where L is the inductance of the inductor and R is the resistance of the inductor. As shown in Equation 3, the Q-factor of an inductor may be inversely proportional to the resistance. Thus, to maximize an inductor's Q-factor, it may be desirable for the inductor to have a low resistance.

If switch 520 is closed (e.g., a transistor is turned on), and the inductance of variable inductor 408 is defined by path 531, the resistance of switch 520 may contribute to the total resistance of variable inductor 408. Accordingly, it may be desirable for switch 520 to have a low resistance. For example, in embodiments in which switch 520 is a transistor, the transistor may have an on-resistance of 1 ohm or less. In some embodiments, conductor 510 may be indented inward at first intersection location 521 and/or at second intersection location 522. One or more indentations may help minimize the distance between first intersection location 521 and second intersection location 522, and thus help minimize the resistance of switch 520. For example, as described above, switch 520 may include an NMOS or a PMOS transistor. The on-resistance of a transistor, such as an NMOS or PMOS, may be inversely proportional to a width-to-length ratio ("W/L") of a conductive channel of the transistor. In embodiments of switch 520 that include an NMOS or a PMOS transistor, the indentations may reduce the length of the NMOS's or PMOS's conductive channel, thus minimizing the on-resistance of the transistor.

In some embodiments, there may be a void of other structures of conductive material routed substantially parallel to conductor 510. As such, there may be a lack of other structures that could substantially impact the inductance of variable inductor 408 via an electromagnetic coupling to conductor 510. In such configurations, conductor 510 and variable inductor 408 may be referred to as "electromagnetically isolated." The term "electromagnetically isolated," however, does not necessarily exclude all parasitic or other nominal electromagnetic coupling to other structures.

In some embodiments, all routing on other layers of conductive material may be excluded from the area above or below conductor 510 regardless of whether that routing is substantially parallel to path 531 or path 532. Such an exclusion may result in a lack of any "overlaps" between conductor 510 on one layer of conductive material and other routes on one or more other layers of conductive material, and thus may further reduce undesired electromagnetic coupling effects.

Figure 6:
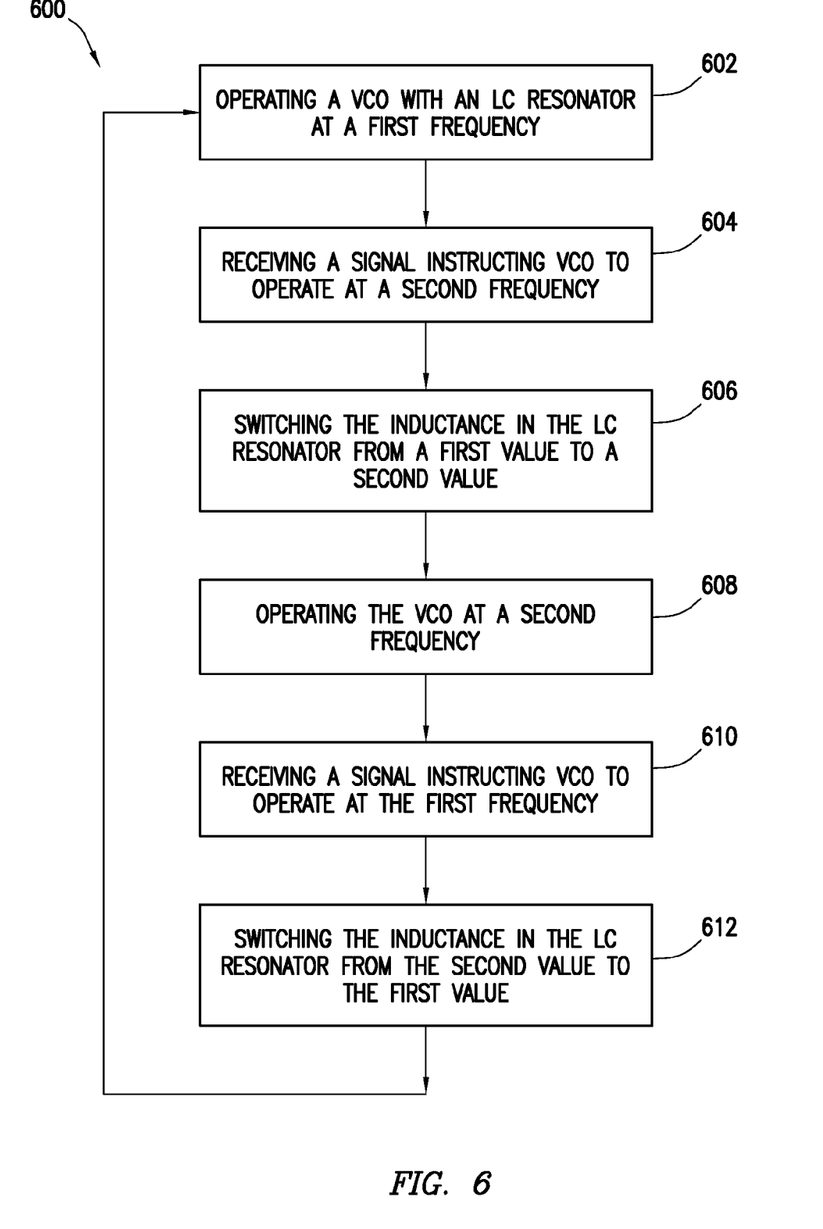
FIG. 6 depicts a flow chart of an example method for switching a variable inductor from a first state to a second state, in accordance with certain embodiments of the present disclosure.

FIG. 6 depicts a flow chart of an example method 600 for switching a variable inductor from a first state to a second state, in accordance with certain embodiments of the present disclosure.

At step 602, method 600 may require operation at a first frequency. For example, at step 602, VCO 400, as described with reference to FIG. 4, may operate at a first frequency that may correspond to a first inductance setting for variable inductor 408. After method 600 operates at the first frequency, method 600 may proceed to step 604.

At step 604, method 600 may require the receipt of a signal instructing operation at a second frequency. Such an instruction may be received by VCO 400 when a multi-band or multi-mode cellular phone such as terminal 110 as described with reference to FIGS. 1 and 2, changes from a first mode to a second mode for transmitting or receiving wireless communication signals. After a signal is received instructing operation at the second frequency, method 600 may proceed to step 606.

At step 606, method 600 may require that switch 520 be switched from a first state to a second state. For example, switch 520 may be switched from on to off, or from off to on. Changing the state of switch 520 may change the setting of variable inductor 408 from a first inductance to a second inductance. After the state of switch 520 has been changed, method 600 may proceed to step 608.

At step 608, method 600 may require operation at a second frequency. For example, at step 608, VCO 400 may operate at a second frequency that may correspond to the second inductance setting for variable inductor 408. After VCO 400 operates at the second frequency, method 600 may proceed to step 610.

At step 610, method 600 may require the receipt of a signal instructing operation at a first frequency. Such an instruction may be received by VCO 400 when a multi-band or multi-mode cellular phone such as terminal 110 changes from a second mode back to a first mode for transmitting or receiving wireless communication signals. After a signal is received instructing operation at the first frequency, method 600 may proceed to step 612.

At step 612, method 600 may require that switch 520 be switched from a second state back to the first state. Changing the state of switch 520 back to the first state may change the variable inductor 408 back to its first inductance setting. Accordingly, VCO may return to operating at the first frequency as described in step 602.

Although FIG. 6 discloses a particular number of steps to be taken with respect to method 600, method 600 may be executed with greater or lesser steps than those depicted in FIG. 6. For example, method 600 may be executed with steps 602 through 608. In addition, although FIG. 6 discloses a certain order of steps to be taken with respect to method 600, the steps comprising method 600 may be completed in any suitable order. For example, steps 604 and 606 may occur simultaneously.

Although the present disclosure has been described with several embodiments, various changes and modifications may be suggested to one skilled in the art. It is intended that the present disclosure encompass such changes and modifications as fall within the scope of the appended claims.

What is claimed is:

1. A variable inductor, comprising:
 a magnetically isolated single-turn conductor, comprising:
   a first inductor terminal;
   a second inductor terminal;

a first base portion extending from the first inductor terminal to a first intersection location;

a second base portion extending from the second inductor terminal to a second intersection location; and a switched portion extending from the first intersection location to the second intersection location; and a switch comprising a first conductive terminal coupled to the first intersection location and a second conductive terminal coupled to the second intersection location.

2. The variable inductor of claim 1, wherein the single-turn conductor is formed on a single layer of conductive material.

3. The variable inductor of claim 2, wherein no portion of the single-turn conductor formed on the single layer of conductive material overlaps a route formed on a second layer of conductive material.

4. The variable inductor of claim 1, wherein the switch comprises a transistor.

5. The variable inductor of claim 1, wherein the length of the switched portion is greater than the combined length of the first base portion and the second base portion.

6. The variable inductor of claim 1, wherein the length of the switched portion is less than the combined length of the first base portion and the second base portion.

7. The variable inductor of claim 1, wherein the single-turn conductor is indented proximate to the switch.

8. A voltage-controlled oscillator, comprising:

an LC resonator comprising a variable capacitor and a variable inductor, the variable inductor comprising:

a magnetically isolated single-turn conductor comprising:

a first inductor terminal coupled to a first capacitor terminal of the variable capacitor;

a second inductor terminal coupled to a second capacitor terminal of the variable capacitor;

a first base portion extending from the first inductor terminal to a first intersection location;

a second base portion extending from the second inductor terminal to a second intersection location; and a switched portion extending from the first intersection location to the second intersection location; and a switch comprising a first conductive terminal coupled to the first intersection location and a second conductive terminal coupled to the second intersection location;

wherein the inductor is configured to have a first inductance value if the switch is on and a second inductance value if the switch is off; and wherein the voltage-controlled oscillator is configured to oscillate at one or more frequencies within a first range of frequencies if the switch is in a first state and at one or more frequencies within a second range of frequencies if the switch is in a second state.

9. The voltage-controlled oscillator of claim 8, wherein the single-turn conductor is formed on a single layer of conductive material.

10. The voltage-controlled oscillator of claim 9, wherein no portion of the single-turn conductor formed on the single layer of conductive material overlaps a route formed on a second layer of conductive material.

11. The voltage-controlled oscillator of claim 8, wherein the switch comprises an transistor.

12. The voltage-controlled oscillator of claim 8, wherein the length of the switched portion is greater than the combined length of the first base portion and the second base portion.

13. The voltage-controlled oscillator of claim 8, wherein the length of the switched portion is less than the combined length of the first base portion and the second base portion.

14. The voltage-controlled oscillator of claim 8, wherein the single-turn conductor is indented proximate to the switch.

15. The voltage-controlled oscillator of claim 8, wherein the first range of frequencies does not overlap with the second range of frequencies.

16. The voltage-controlled oscillator of claim 15, wherein:

the voltage-controlled oscillator is configured to oscillate at a first frequency within the first range of frequencies if the variable capacitor has a first capacitance value and the switch is in the first state;

the voltage-controlled oscillator is configured to oscillate at a second frequency within the first range of frequencies if the variable capacitor has a second capacitance value and the switch is in the first state;

the voltage-controlled oscillator is configured to oscillate at a third frequency within the second range of frequencies if the variable capacitor has a first capacitance value and the switch is in the second state; and the voltage-controlled oscillator is configured to oscillate at a fourth frequency within the second range of frequencies if the variable capacitor has a second capacitance value and the switch is in the second state.

17. A method, comprising:

operating a voltage-controlled oscillator at a first frequency, the voltage-controlled oscillator comprising an LC-resonator with a variable inductor including a magnetically isolated single-turn conductor;

receiving a first signal instructing the voltage-controlled oscillator to operate at a second frequency;

switching the variable inductor from a first inductance value to a second inductance value; and operating the voltage controlled oscillator at a second frequency.

18. The method of claim 17, comprising:

receiving a second signal instructing the voltage-controlled oscillator to operate at the first frequency; and switching the variable inductor from the second inductance value to the first inductance value.

* * * * *